United States Patent
Nakashima et al.

(10) Patent No.: US 12,233,793 B2
(45) Date of Patent: Feb. 25, 2025

(54) POWER CONVERSION APPARATUS, ELECTRIC POWER SYSTEM FOR AIRCRAFT, AND METHOD OF CONTROLLING POWER CONVERSION APPARATUS

(71) Applicant: Mitsubishi Electric Corporation, Tokyo (JP)

(72) Inventors: Junichi Nakashima, Tokyo (JP); Kenji Fujiwara, Tokyo (JP); Kozo Harada, Tokyo (JP); Kunihiko Tajiri, Tokyo (JP); Yuji Shirakata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 16 days.

(21) Appl. No.: 18/019,248

(22) PCT Filed: Sep. 7, 2020

(86) PCT No.: PCT/JP2020/033822
§ 371 (c)(1),
(2) Date: Feb. 2, 2023

(87) PCT Pub. No.: WO2022/049778
PCT Pub. Date: Mar. 10, 2022

(65) Prior Publication Data
US 2023/0271579 A1 Aug. 31, 2023

(51) Int. Cl.
*B60R 16/03* (2006.01)
*H02M 7/00* (2006.01)
*H02M 7/48* (2007.01)

(52) U.S. Cl.
CPC ............ *B60R 16/03* (2013.01); *H02M 7/003* (2013.01); *H02M 7/48* (2013.01); *B64D 2221/00* (2013.01); *H02J 2310/44* (2020.01)

(58) Field of Classification Search
CPC ......... B60R 16/03; H02M 7/003; H02M 7/48; H02J 2310/44; B64D 2221/00
See application file for complete search history.

(56) References Cited

U.S. PATENT DOCUMENTS

| | | | |
|---|---|---|---|
| 2003/0151893 A1* | 8/2003 | Meyer | H02M 7/003 361/689 |
| 2010/0025126 A1* | 2/2010 | Nakatsu | H05K 7/1432 361/699 |

FOREIGN PATENT DOCUMENTS

| | | |
|---|---|---|
| DE | 10 2017 221 999 A1 | 6/2019 |
| JP | 8-136769 A | 5/1996 |
| JP | 2003-152122 A | 5/2003 |
| JP | 2009-254150 A | 10/2009 |

(Continued)

OTHER PUBLICATIONS

International Search Report and Written Opinion mailed on Oct. 27, 2020, received for PCT Application PCT/JP2020/033822, filed on Sep. 7, 2020, 9 pages including English Translation.

(Continued)

*Primary Examiner* — Carlos Amaya
(74) *Attorney, Agent, or Firm* — XSENSUS LLP

(57) ABSTRACT

A power conversion apparatus includes a hermetic housing, a power semiconductor module, and dry gas. The hermetic housing includes a gas inlet valve and a gas outlet valve. The power semiconductor module is arranged in an internal space in the hermetic housing. The internal space in the hermetic housing is filled with dry gas.

18 Claims, 10 Drawing Sheets

(56) References Cited

FOREIGN PATENT DOCUMENTS

| JP | 2013-78216 A | 4/2013 |
|---|---|---|
| JP | 2017-118661 A | 6/2017 |

OTHER PUBLICATIONS

Extended European Search Report issued Oct. 2, 2023, in corresponding European Patent Application No. 20952512.0, 10 pages.

* cited by examiner

POWER CONVERSION APPARATUS, ELECTRIC POWER SYSTEM FOR AIRCRAFT, AND METHOD OF CONTROLLING POWER CONVERSION APPARATUS

CROSS-REFERENCE TO RELATED APPLICATION

The present application is based on PCT filing PCT/JP2020/033822, filed Sep. 7, 2020, the entire contents of which are incorporated herein by reference.

TECHNICAL FIELD

The present disclosure relates to a power conversion apparatus, an electric power system for an aircraft, and a method of controlling a power conversion apparatus.

BACKGROUND ART

Japanese Patent Laying-Open No. 2009-254150 (PTL 1) discloses an electrically powered vehicle including a waterproof casing, a power control unit, an atmospheric pressure sensor, and a ventilation filter. The power control unit is arranged in the waterproof casing. The power control unit includes a boost converter, an inverter, and a boost converter controller. The boost converter boosts a power supply voltage and supplies the boosted power supply voltage to a motor. The inverter converts a direct-current (DC) current from a power supply to an alternating-current (AC) current and supplies the AC current to the motor. The boost converter controller controls the boost converter based on an output from the atmospheric pressure sensor. Specifically, when the electrically powered vehicle travels a highland where the atmospheric pressure is low, the boost converter controller sets an upper limit value of a boosted voltage. Since boost by the boost converter is restricted, breakdown of the power control unit can be prevented. The ventilation filter is provided in a through hole provided in the waterproof casing. The ventilation filter catches moisture and dusts contained in air and allows passage therethrough only of air.

CITATION LIST

Patent Literature

PTL 1: Japanese Patent Laying-Open No. 2009-254150

SUMMARY OF INVENTION

Technical Problem

When moisture adheres to the ventilation filter in the electrically powered vehicle disclosed in PTL 1, however, the atmospheric pressure sensor outputs an abnormal value. During a period until the ventilation filter is dried, control of the boost converter by the boost converter controller is temporarily stopped. In an environment at a lower barometric pressure and a higher humidity such as an aircraft that flies at a higher altitude, however, the ventilation filter is not dried. Therefore, a power unit in PTL 1 including the waterproof casing, the power control unit, the atmospheric pressure sensor, and the ventilation filter cannot be used in the environment at the lower barometric pressure and the higher humidity. The present disclosure was made in view of problems above and an object thereof is to provide a power conversion apparatus that can be used in an environment at a lower pressure and a higher humidity.

Solution to Problem

A power conversion apparatus in the present disclosure includes a hermetic housing, a power semiconductor module, and dry gas. The hermetic housing includes a gas inlet valve and a gas outlet valve. The power semiconductor module is arranged in an internal space in the hermetic housing. The internal space in the hermetic housing is filled with dry gas.

An electric power system for an aircraft in the present disclosure includes a power supply and the power conversion apparatus in the present disclosure electrically connected to the power supply.

A method of controlling a power conversion apparatus in the present disclosure is a method of controlling the power conversion apparatus in the present disclosure mounted on an aircraft. The method of controlling a power conversion apparatus in the present disclosure includes keeping a gas inlet valve and a gas outlet valve closed while the aircraft is moving.

Advantageous Effects of Invention

In the power conversion apparatus in the present disclosure, the internal space in the hermetic housing is filled with dry gas. Therefore, even in an environment at a lower barometric pressure and a higher humidity, a pressure in the hermetic housing is kept high and the humidity in the hermetic housing is kept low. Occurrence of poor insulation, electromigration, corrosion, and partial discharge in the power semiconductor module can be prevented. The power conversion apparatus in the present disclosure can be used in the environment at the lower barometric pressure and the higher humidity.

Since the electric power system for the aircraft in the present disclosure includes the power conversion apparatus in the present disclosure, the electric power system for the aircraft in the present disclosure can be used in the environment at the lower barometric pressure and the higher humidity.

With the method of controlling a power conversion apparatus in the present disclosure, even when the power conversion apparatus is in the environment at the lower barometric pressure and the higher humidity while the aircraft is flying, occurrence of poor insulation, electromigration, corrosion, and partial discharge in the power semiconductor module can be prevented. The method of controlling a power conversion apparatus in the present disclosure allows use of the power conversion apparatus in the environment at the lower barometric pressure and the higher humidity.

DESCRIPTION OF EMBODIMENTS

Figure 1:
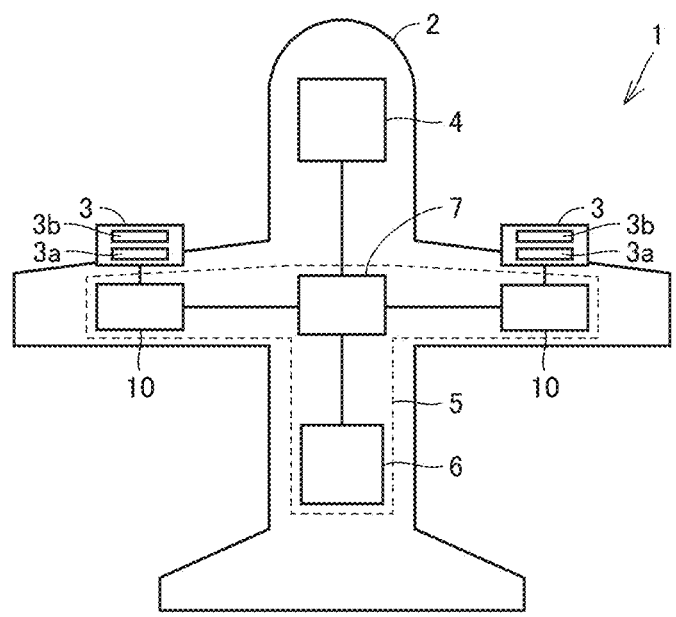
FIG. 1 is a schematic diagram of an electric aircraft in a first embodiment.
Figure 2:
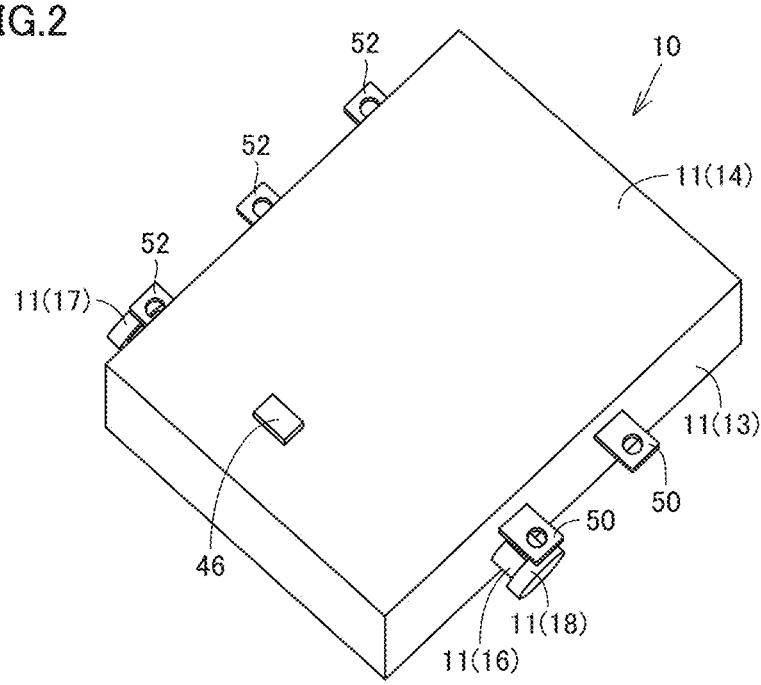
FIG. 2 is a schematic perspective view of a power conversion apparatus in the first embodiment.

An embodiment will be described below. The same features have the same reference characters allotted and description thereof will not be repeated.

First Embodiment

Referring to FIG. 1, a power conversion apparatus 10 is mounted on an aircraft such as an electric aircraft 1. Electric aircraft 1 includes an airframe 2, an electric engine 3, a flight control device 4, and an electric power system 5.

Electric engine 3 is fixed to airframe 2. Electric engine 3 includes a motor 3a and a fan 3b rotated by motor 3a. As fan 3b is rotated, thrust force of electric aircraft 1 is obtained. Flight control device 4 is provided in airframe 2. Flight control device 4 is electrically connected, for example, to electric engine 3 and a hydraulic actuator (not shown) to drive an elevator, a rudder, and an aileron of airframe 2. Flight control device 4 controls operations of electric aircraft 1. Electric power system 5 is provided in airframe 2. Electric power system 5 supplies electric power to flight control device 4, electric engine 3, and the hydraulic actuator (not shown) to drive the elevator, the rudder, and the aileron of airframe 2.

Electric power system 5 includes a power supply 6 and a power conversion apparatus 10. Electric power system 5 may further include a DC converter 7. Power supply 6 is, for example, a battery to generate a DC voltage or a power generator to generate an AC voltage. DC converter 7 is an AC/DC converter to convert an AC voltage to a DC voltage or a DC/DC converter (for example, a boost converter) to convert a DC voltage to another DC voltage. Power conversion apparatus 10 has one end electrically connected to power supply 6 and has the other end electrically connected to a load (for example, motor 3a). Particularly, power conversion apparatus 10 has one end electrically connected to power supply 6 with DC converter 7 being interposed.

Power conversion apparatus 10 will be described with reference to FIGS. 2 to 12. Power conversion apparatus 10 includes a hermetic housing 11, a power semiconductor module 21, dry gas 55, bus bars 50 and 52, and a control circuit substrate 45. Power conversion apparatus 10 may further include a capacitor 40 and a controller 80. Power conversion apparatus 10 may further include a thermally conductive layer 38.

Hermetic housing 11 is formed, for example, of a resin such as an epoxy resin. Hermetic housing 11 includes a wall which defines an internal space 19 in hermetic housing 11. Specifically, hermetic housing 11 includes a bottom wall 12, a sidewall 13, and a top wall 14. Sidewall 13 is connected to bottom wall 12 and top wall 14. Bottom wall 12, sidewall 13, and top wall 14 define internal space 19 in hermetic housing 11.

Hermetic housing 11 includes a gas inlet valve 15 and a gas outlet valve 16. Gas inlet valve 15 and gas outlet valve 16 are, for example, normally closed valves. Gas inlet valve 15 and gas outlet valve 16 are provided in a wall of hermetic housing 11. For example, gas inlet valve 15 and gas outlet valve 16 are provided in sidewall 13 of hermetic housing 11. Gas inlet valve 15 and gas outlet valve 16 are air-tightly fixed to the wall (for example, sidewall 13) of hermetic housing 11.

Figure 6:
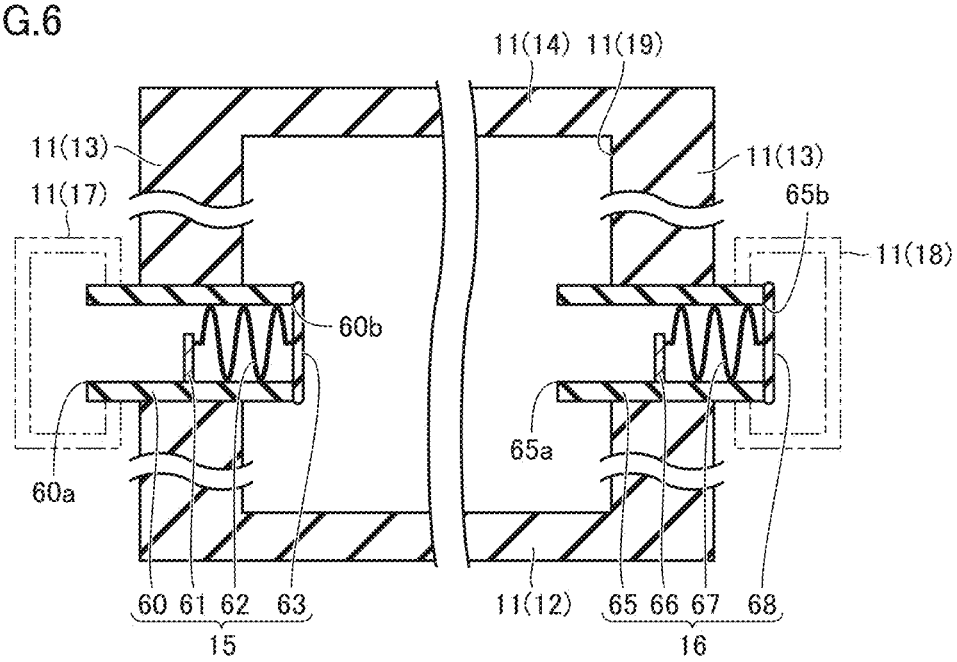
FIG. 6 is a partially enlarged schematic cross-sectional view of the power conversion apparatus in the first embodiment.

Referring to FIG. 6, gas inlet valve 15 includes a pipe 60, a post 61, a spring 62, and a lid 63. Pipe 60 includes an inlet 60a arranged outside hermetic housing 11 and an outlet 60b arranged in internal space 19 in hermetic housing 11. Post 61 is provided in pipe 60 and fixed to pipe 60. Lid 63 is arranged in internal space 19 in hermetic housing 11 and outlet 60b of pipe 60 can be opened and closed by lid 63. Specifically, spring 62 is connected to post 61 and lid 63. Spring 62 biases lid 63 toward pipe 60. Outlet 60b of pipe 60 is normally closed by lid 63.

Gas outlet valve 16 includes a pipe 65, a post 66, a spring 67, and a lid 68. Pipe 65 includes an inlet 65a arranged in internal space 19 in hermetic housing 11 and an outlet 65b arranged outside hermetic housing 11. Post 66 is provided in pipe 65 and fixed to pipe 65. Lid 68 is arranged outside hermetic housing 11 and outlet 65b of pipe 65 can be opened and closed by lid 68. Specifically, spring 67 is connected to post 66 and lid 68. Spring 67 biases lid 68 toward pipe 65. Outlet 65b of pipe 65 is normally closed by lid 68.

Hermetic housing 11 may further include caps 17 and 18. Inlet 60a of gas inlet valve 15 can be opened and closed by cap 17. Outlet 65b of gas outlet valve 16 can be opened and closed by cap 18. For example, while an aircraft (for example, electric aircraft 1) is moving, inlet 60a of gas inlet valve 15 is closed by cap 17 and outlet 65b of gas outlet valve 16 is closed by cap 18. Caps 17 and 18 prevent backflow of dry gas 55 or air.

As the aircraft (for example, electric aircraft 1) is used for a longer period, dry gas 55 leaks from hermetic housing 11 little by little and a pressure of dry gas 55 in hermetic housing 11 may become low. Therefore, the pressure of dry gas 55 in hermetic housing 11 may have to be adjusted. The pressure of dry gas 55 in hermetic housing 11 is adjusted while the aircraft remains stopped. Specifically, gas inlet valve 15 is opened and inlet 60a of gas inlet valve 15 is opened by opening of cap 17 or gas outlet valve 16 is opened and outlet 65b of gas outlet valve 16 is opened by opening of cap 18, to thereby adjust the pressure of dry gas 55 in hermetic housing 11.

When power semiconductor module 21 malfunctions or fails, a temperature of power semiconductor module 21 may abruptly increase and the pressure of dry gas 55 in hermetic housing 11 may abruptly increase. As the pressure of dry gas 55 in hermetic housing 11 abruptly increases, gas outlet valve 16 is opened and outlet 65b of gas outlet valve 16 is opened by opening of cap 18. Dry gas 55 is emitted to the outside of hermetic housing 11 and the pressure of dry gas 55 in hermetic housing 11 lowers. Hermetic housing 11 is thus prevented from being broken.

Power semiconductor module 21 is arranged in internal space 19 in hermetic housing 11. Specifically, referring to FIG. 4, power semiconductor module 21 is arranged on bottom wall 12 of hermetic housing 11. Particularly, power semiconductor module 21 is arranged on bottom wall 12 of hermetic housing 11 with thermally conductive layer 38 being interposed. Thermally conductive layer 38 is arranged between power semiconductor module 21 and hermetic housing 11 (bottom wall 12). Thermally conductive layer 38 transmits heat generated in power semiconductor module 21 to hermetic housing 11 (bottom wall 12) at a low thermal resistance. For example, heat radiation grease or a heat conduction sheet serves as thermally conductive layer 38. Power semiconductor module 21 is fixed to hermetic housing 11, for example, with the use of a fixing member 39 such as a screw.

Figure 5:
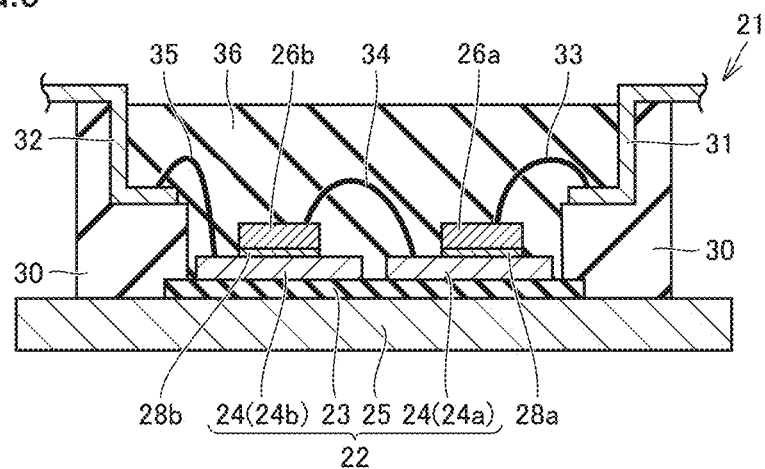
FIG. 5 is a schematic cross-sectional view of a power semiconductor module included in the power conversion apparatus in the first embodiment.

Referring to FIG. 5, power semiconductor module 21 mainly includes an insulating substrate 22, power semiconductor elements 26a and 26b, a casing 30, an input terminal 31, an output terminal 32, conductive wires 33, 34, and 35, and a sealing member 36.

Figure 4:
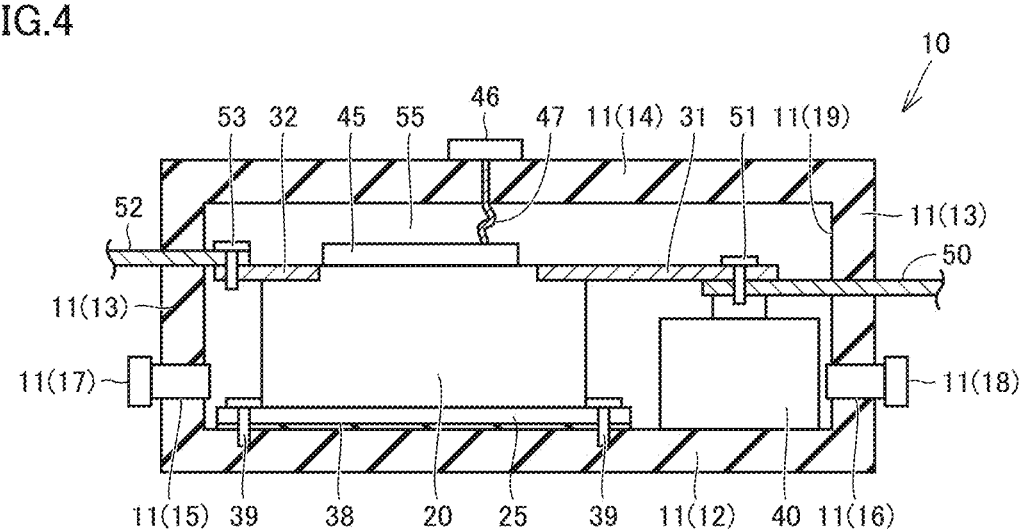
FIG. 4 is a schematic cross-sectional view along the line IV-IV shown in FIG. 3, of the power conversion apparatus in the first embodiment.

Insulating substrate 22 includes an insulating layer 23, a conductive circuit pattern 24, and a base plate 25. For example, a resin sheet such as an epoxy resin sheet or a ceramic substrate such as a silicon nitride ceramic substrate serves as insulating layer 23. Conductive circuit pattern 24 is provided on a front surface of insulating layer 23. Conductive circuit pattern 24 may be composed of copper or aluminum. Conductive circuit pattern 24 includes a first conductive circuit pattern portion 24a and a second conductive circuit pattern portion 24b distant from first conductive circuit pattern portion 24a. Base plate 25 is provided on a rear surface of insulating layer 23. Base plate 25 is, for example, a metallic plate such as a copper plate or an aluminum plate. Referring to FIG. 4, base plate 25 is fixed to bottom wall 12 of hermetic housing 11, for example, with the use of fixing member 39 such as a screw. Base plate 25 has a ground potential.

Power semiconductor elements 26a and 26b are each implemented, for example, by an insulate gate bipolar transistor (IGBT) or a metal oxide semiconductor field effect transistor (MOSFET). Power semiconductor elements 26a and 26b are each formed, for example, of a semiconductor material such as silicon (Si), silicon carbide (SiC), gallium nitride (GaN), or gallium oxide ($Ga_2O_3$). Power semiconductor elements 26a and 26b are joined to conductive circuit pattern 24. Specifically, power semiconductor element 26a is joined to first conductive circuit pattern portion 24a with a conductive joint member 28a such as solder or a metal fine-particle sintered material. Power semiconductor element 26b is joined to second conductive circuit pattern portion 24b with a conductive joint member 28b such as solder or a metal fine-particle sintered material.

Casing 30 is bonded, for example, to insulating substrate 22. Casing 30 is formed, for example, of an electrically insulating resin such as polyphenylene sulfide (PPS).

Casing 30 is provided with input terminal 31 and output terminal 32. Input terminal 31 and output terminal 32 are formed, for example, of a metal such as copper or aluminum. Input terminal 31 is electrically connected to power supply 6 or DC converter 7 (see FIG. 1). Output terminal 32 is electrically connected to a load such as motor 3a (see FIG. 1).

Conductive wires 33, 34, and 35 are each, for example, a metallic wire such as a copper wire, a gold wire, or an aluminum wire. Conductive wire 33 is joined to input terminal 31 and power semiconductor element 26a. Conductive wire 34 is joined to first conductive circuit pattern portion 24a and power semiconductor element 26b. Conductive wire 35 is joined to second conductive circuit pattern portion 24b and output terminal 32.

Sealing member 36 is provided in casing 30. Power semiconductor elements 26a and 26b are sealed with sealing member 36. Conductive wires 33, 34, and 35 may further be sealed with sealing member 36. Sealing member 36 is formed of an insulating resin such as an epoxy resin.

Figure 3:
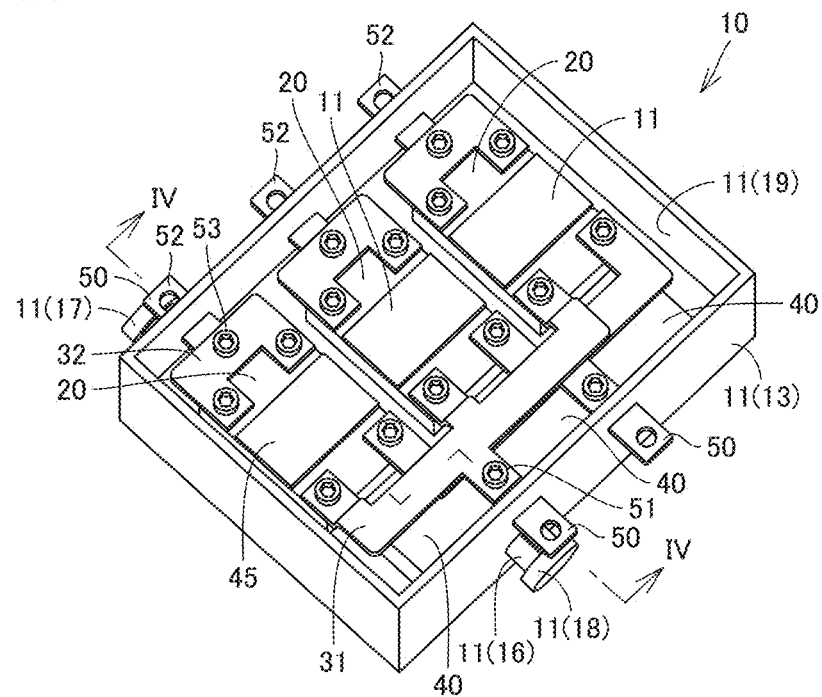
FIG. 3 is a schematic perspective view of the power conversion apparatus in the first embodiment.

Referring to FIGS. 3 and 4, capacitor 40 is connected to input terminal 31. Specifically, input terminal 31 is coupled to capacitor 40 with a fixing member 51 such as a screw. Capacitor 40 smoothens a ripple voltage contained in a DC voltage provided to power semiconductor module 21. Capacitor 40 is arranged in internal space 19 in hermetic housing 11. Specifically, capacitor 40 is arranged on bottom wall 12 of hermetic housing 11. Capacitor 40 may be arranged outside hermetic housing 11.

Bus bars 50 and 52 are formed of a metal such as copper or aluminum. Bus bar 50 is connected to input terminal 31 and capacitor 40. Specifically, bus bar 50 is coupled to input terminal 31 and capacitor 40 with fixing member 51 such as a screw. Bus bar 52 is connected to output terminal 32. Specifically, bus bar 52 is coupled to output terminal 32 with a fixing member 53 such as a screw. Bus bars 50 and 52 pass through a wall (for example, sidewall 13) which defines internal space 19 in hermetic housing 11. Bus bars 50 and 52 are air-tightly fixed to the wall (for example, sidewall 13) of hermetic housing 11.

Control circuit substrate 45 is electrically connected to power semiconductor module 21. Control circuit substrate 45 is provided with a control circuit of power semiconductor module 21. Control circuit substrate 45 may be arranged in internal space 19 in hermetic housing 11. Specifically, control circuit substrate 45 may be arranged on power semiconductor module 21. Control circuit substrate 45 is connected to a signal line 47. Signal line 47 is formed, for example, of a conductive material such as copper or aluminum. Signal line 47 passes through the wall (for example, top wall 14) of hermetic housing 11 and extends to a connector 46 arranged outside hermetic housing 11. Signal line 47 is air-tightly fixed to the wall (for example, top wall 14) of hermetic housing 11. Sealed. Connector 46 is provided, for example, on the wall (for example, top wall 14) of hermetic housing 11. Control circuit substrate 45 may be arranged outside hermetic housing 11.

Figure 7:
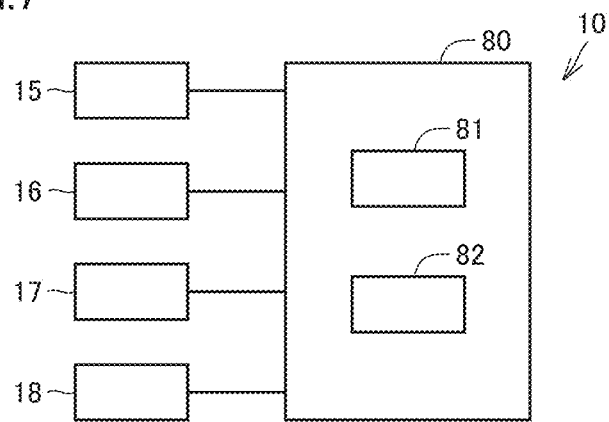
FIG. 7 is a block diagram of the power conversion apparatus in the first embodiment.

Referring to FIG. 7, controller 80 includes a valve controller 81 and a cap controller 82. Controller 80 is implemented, for example, by an electrical circuit or a semiconductor processor such as a CPU. Controller 80 may be mounted on control circuit substrate 45. Controller 80 may be arranged outside hermetic housing 11 and may electrically be connected to connector 46 and signal line 47 through an electrical line (not shown).

Valve controller 81 controls an opening or closing operation of at least one of gas inlet valve 15 or gas outlet valve 16. Valve controller 81 is implemented, for example, by an electrical circuit to control an opening or closing operation of at least one of gas inlet valve 15 or gas outlet valve 16 or a semiconductor processor programmed to cause the opening or closing operation of at least one of gas inlet valve 15 or gas outlet valve 16. Valve controller 81 has at least one of gas inlet valve 15 or gas outlet valve 16 open only while the aircraft (for example, electric aircraft 1) remains stopped. The aircraft remaining stopped means, for example, the aircraft remaining stopped at an apron of an airport or an aircraft maintenance factory. In contrast, while the aircraft is moving, valve controller 81 does not act on gas inlet valve 15 and gas outlet valve 16 and gas inlet valve 15 and gas outlet valve 16 remain closed. More specifically, while the aircraft is moving, no power is fed to gas inlet valve 15 and inlet 60a remains mechanically closed, for example, by biasing force of spring 62 and no power is fed to gas outlet valve 16 and outlet 65b remains mechanically closed, for example, by biasing force of spring 67.

Cap controller 82 controls an opening or closing operation of caps 17 and 18. Cap controller 82 is implemented, for example, by an electrical circuit to control an opening or closing operation of caps 17 and 18 or a semiconductor processor programmed to cause the opening or closing operation of caps 17 and 18. Only while the aircraft (for example, electric aircraft 1) remains stopped, inlet 60a of gas inlet valve 15 is opened by opening of cap 17 and outlet 65b of gas outlet valve 16 is opened by opening of cap 18. In contrast, while the aircraft is moving, cap controller 82 does not act on caps 17 and 18, and inlet 60a of gas inlet valve 15 is kept closed by cap 17 and outlet 65b of gas outlet valve 16 is kept closed by cap 18. More specifically, while the aircraft is moving, no power is fed to cap 17 and inlet 60a remains mechanically closed by cap 17 and no power is fed to cap 18 and outlet 65b remains mechanically closed by cap 18.

Referring to FIG. 4, internal space 19 in hermetic housing 11 is filled with dry gas 55. Dry gas 55 is, for example, dry air, dry nitrogen gas, or mixture gas of dry air and dry nitrogen gas. A partial pressure of water vapor contained in dry gas 55 at a maximum temperature (for example, 0° C. or 10° C.) of a range of temperatures where occurrence of condensation in internal space 19 in hermetic housing 11 is permitted is equal to or lower than a saturated water vapor pressure at the maximum temperature. The pressure of dry gas 55 in hermetic housing 11 is higher than an ambient pressure $P_0$ (see FIGS. 8 and 12) outside hermetic housing 11 at the time of injection of dry gas 55 into internal space 19 in hermetic housing 11.

A method of injecting dry gas 55 into internal space 19 in hermetic housing 11 will be described with reference to FIGS. 4, 6, and 8 to 11.

Figure 8:
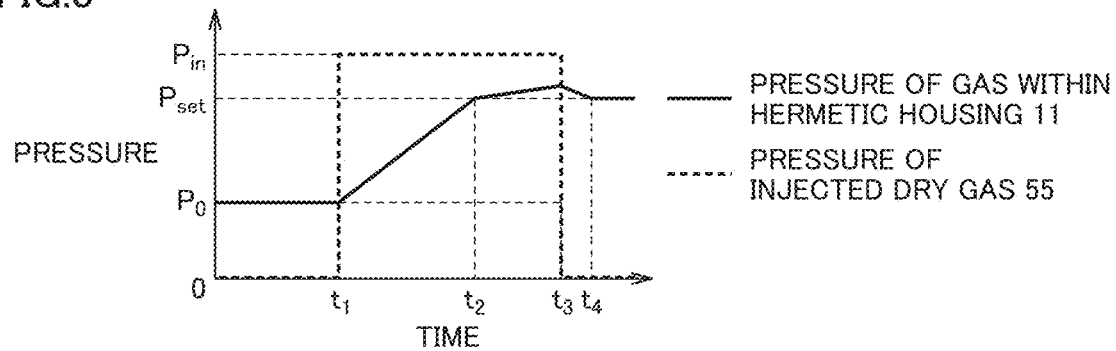
FIG. 8 is a diagram showing change over time in pressure of gas in a hermetic housing and in pressure of injected dry gas when dry gas is injected into an internal space in the hermetic housing.
Figure 9:
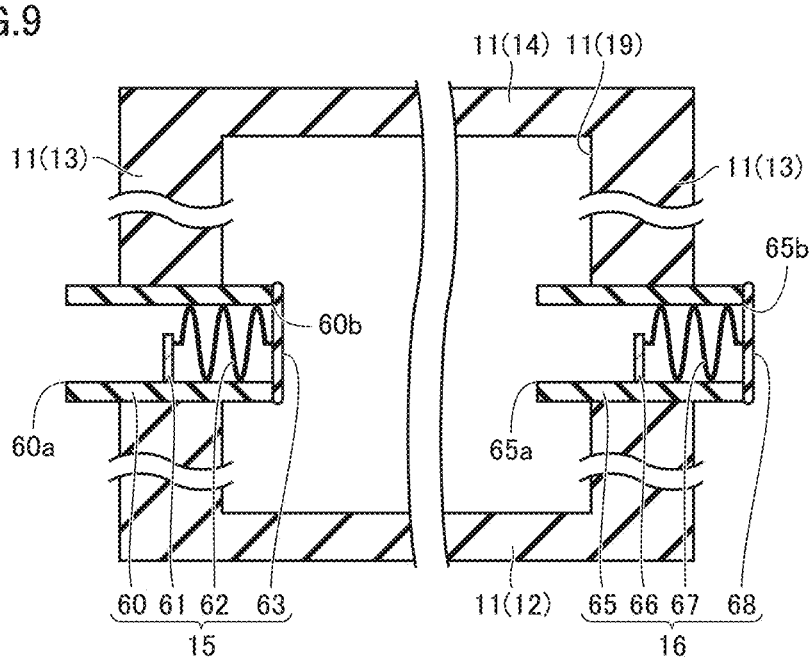
FIG. 9 is a partially enlarged schematic cross-sectional view of the power conversion apparatus in the first embodiment before injection of dry gas into the hermetic housing.

Referring to FIGS. 8 and 9, at the time of arrangement of power semiconductor module 21 in internal space 19 in hermetic housing 11, internal space 19 in hermetic housing 11 is filled with air similarly to the outside of hermetic housing 11. A pressure in hermetic housing 11 is equal to ambient pressure $P_0$ (for example, atmospheric pressure) outside hermetic housing 11. Gas inlet valve 15 and gas outlet valve 16 are closed.

Figure 10:
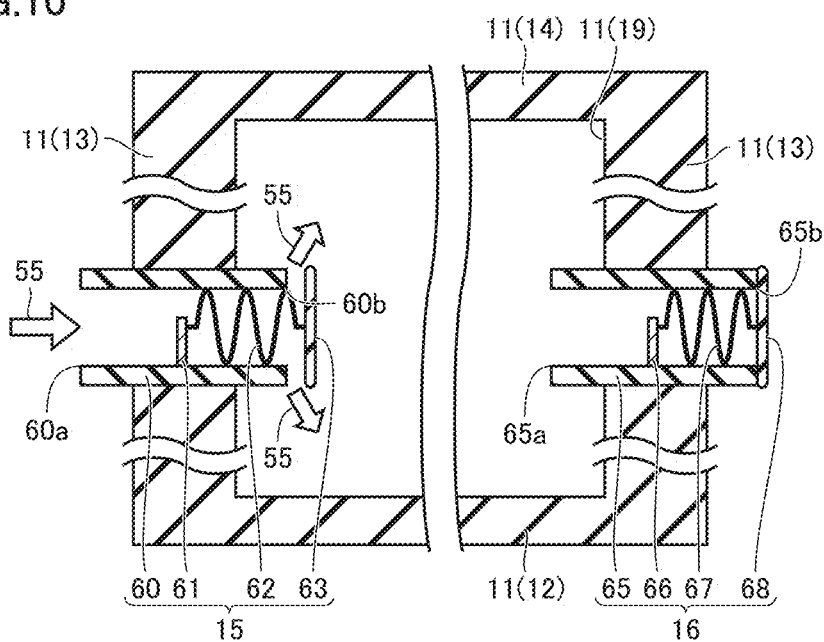
FIG. 10 is a partially enlarged schematic cross-sectional view of the power conversion apparatus in the first embodiment during injection of dry gas into the hermetic housing.

Referring to FIGS. 8 and 10, at time $t_1$, dry gas 55 at a pressure $P_{in}$ higher than ambient pressure $P_0$ outside hermetic housing 11 is injected through inlet 60a of gas inlet valve 15. Gas inlet valve 15 is opened, for example, at a setting pressure $P_{set}$ higher than ambient pressure $P_0$. Pressure $P_{in}$ of dry gas 55 injected through inlet 60a of gas inlet valve 15 is higher than setting pressure $P_{set}$. Pressure $P_{in}$ of dry gas 55 moves lid 63 away from outlet 60b of pipe 60 and gas inlet valve 15 is opened. As dry gas 55 is injected into internal space 19 in hermetic housing 11, the pressure in hermetic housing 11 increases. The pressure in hermetic housing 11 is not high enough to move lid 68 away from outlet 65b of pipe 65. Gas outlet valve 16 remains closed.

Figure 11:
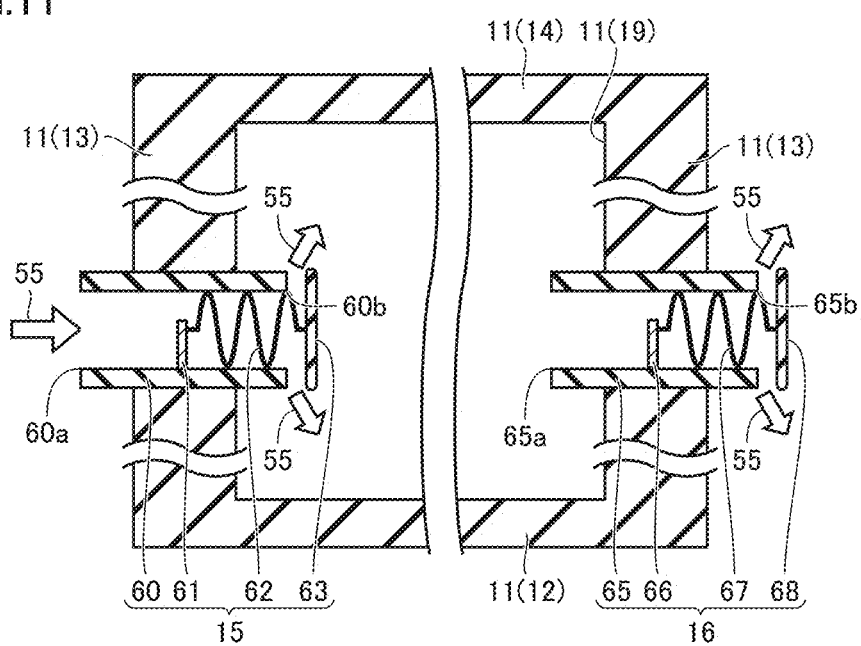
FIG. 11 is a partially enlarged schematic cross-sectional view of the power conversion apparatus in the first embodiment during injection of dry gas into the hermetic housing.

Referring to FIGS. 8 and 11, gas outlet valve 16 is opened, for example, at setting pressure $P_{set}$ higher than ambient pressure $P_0$. At time $t_2$, a pressure of mixture gas of air and dry gas 55 in hermetic housing 11 reaches setting pressure $P_{set}$. The pressure of dry gas in hermetic housing 11 moves lid 68 away from outlet 65b of pipe 65 and gas outlet valve 16 is opened. Injection of dry gas 55 into internal space 19 in hermetic housing 11 through gas inlet valve 15 is continued also after time $t_2$. Air with which internal space 19 in hermetic housing 11 has been filled at the time of arrangement of power semiconductor module 21 in internal space 19 in hermetic housing 11 is completely exhausted and internal space 19 in hermetic housing 11 is filled with dry gas 55.

Referring to FIG. 8, at time $t_3$, injection of dry gas 55 is stopped. As injection of dry gas 55 is stopped, gas inlet valve 15 is mechanically closed, for example, by biasing force of spring 62. When the pressure of dry gas 55 in hermetic housing 11 lowers to setting pressure $P_{set}$ at time $t_4$, gas outlet valve 16 is mechanically closed, for example, by biasing force of spring 67. As shown in FIGS. 4 and 6, internal space 19 in hermetic housing 11 is thus filled with dry gas 55 at setting pressure $P_{set}$.

A method of controlling power conversion apparatus 10 in the present embodiment will be described. Power conversion apparatus 10 is mounted on an aircraft (for example, electric aircraft 1). The method of controlling power conversion apparatus 10 in the present embodiment includes keeping gas inlet valve 15 and gas outlet valve 16 closed while the aircraft is moving. For example, while the aircraft is moving, valve controller 81 does not act on gas inlet valve 15 and gas outlet valve 16 and gas inlet valve 15 and gas outlet valve 16 are kept closed. More specifically, while the aircraft is moving, no power is fed to gas inlet valve 15 and inlet 60a remains mechanically closed, for example, by biasing force of spring 62 and no power is fed to gas outlet valve 16 and outlet 65b remains mechanically closed, for example, by biasing force of spring 67.

The method of controlling power conversion apparatus 10 in the present embodiment further includes opening at least one of gas inlet valve 15 or gas outlet valve 16 only while the aircraft remains stopped. For example, while gas inlet valve 15 is open, dry gas 55 is injected into internal space 19 in hermetic housing 11. The pressure of dry gas 55 in hermetic housing 11 is higher than ambient pressure $P_0$ outside hermetic housing 11 at the time of injection of dry gas 55 into internal space 19 in hermetic housing 11.

An exemplary method of setting setting pressure $P_{set}$ of dry gas 55 will be described with reference to FIG. 12.

When dry gas 55 is injected into hermetic housing 11 or the pressure of dry gas 55 in hermetic housing 11 is adjusted on the ground, the temperature of internal space 19 in hermetic housing 11 is equal to an ambient temperature $T_0$ outside hermetic housing 11 and the pressure of dry gas 55 in a hermetic space is equal to ambient pressure $P_0$ outside hermetic housing 11. Ambient temperature $T_0$ is, for example, 25° C. A lower limit temperature of a range of temperatures where power conversion apparatus 10 is used is defined as $T_{i\_min}$ and an upper limit temperature of the range of temperatures where power conversion apparatus 10 is used is defined as $T_{i\_max}$. In one example, lower limit temperature $T_{i\_min}$ and upper limit temperature $T_{i\_max}$ of the range of temperatures where power conversion apparatus 10 is used may be a lower limit temperature and an upper limit temperature of operating temperatures of power conversion apparatus 10 described in specifications of power conversion apparatus 10, respectively. In another example, when power conversion apparatus 10 is mounted on an aircraft (for example, electric aircraft 1), lower limit temperature $T_{i\_min}$ and upper limit temperature $T_{i\_max}$ of the range of temperatures where power conversion apparatus 10 is used are determined by a route or the like of the aircraft. A range of temperatures $T_i$ of gas in hermetic housing 11 is equal to or higher than lower limit temperature $T_{i\_min}$ and equal to or lower than upper limit temperature $T_{i\_max}$. When power conversion apparatus 10 is mounted on the aircraft, lower limit temperature $T_{i\_min}$ is, for example, −60° C. and upper limit temperature $T_{i\_max}$ is, for example, 180° C.

Figure 12:
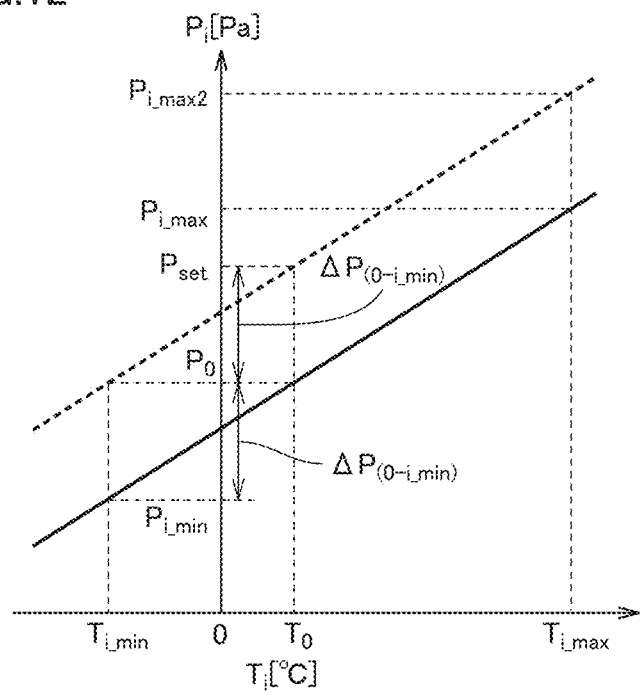
FIG. 12 is a diagram showing relation between a temperature of gas in the hermetic housing and a pressure of gas in the hermetic housing.

Based on an equation of state of gas PV=nR (T+273.15), as shown with a solid line in FIG. 12, a pressure $P_i$ of dry gas 55 in hermetic housing 11 varies with temperature $T_i$ of dry gas 55 in hermetic housing 11. P represents a pressure of gas in hermetic housing 11, V represents a volume of gas in hermetic housing 11, n represents an amount of substance (the number of moles) of gas in hermetic housing 11, R represents a gas constant of gas in hermetic housing 11, and T represents a Celsius temperature of gas in hermetic housing 11. For example, when temperature $T_i$ of dry gas 55 in hermetic housing 11 increases from ambient temperature $T_0$ to upper limit temperature $T_{i\_max}$, pressure $P_i$ of dry gas 55 in hermetic housing 11 increases from ambient pressure $P_0$ to an upper limit pressure $P_{i\_max}$. When the temperature of internal space 19 in hermetic housing 11 lowers from ambient temperature $T_0$ to lower limit temperature $T_{i\_min}$, pressure $P_i$ of dry gas 55 in hermetic housing 11 lowers from ambient pressure $P_0$ to a lower limit pressure $P_{i\_min}$.

In general, when a pressure of an atmosphere around an electronic component lowers, a discharge start voltage in the electronic component lowers (the Paschen's law) and partial discharge is likely in the electronic component. While an aircraft (for example, electric aircraft 1) is flying at a high altitude (for example, an altitude equal to or higher than 5000 m), the discharge start voltage in power conversion apparatus 10 lowers and partial discharge may occur in power conversion apparatus 10. Then, power conversion apparatus 10 should be designed such that partial discharge does not occur in power conversion apparatus 10 at lower limit temperature $T_{i\_min}$ of the range of temperatures where power conversion apparatus 10 is used. Partial discharge in power conversion apparatus 10 occurs, for example, between two members different in voltage from each other in power conversion apparatus 10. Exemplary combinations of two such members include a combination of input terminal 31 and base plate 25, a combination of output terminal 32 and base plate 25, a combination of power semiconductor module 21 and control circuit substrate 45, and a pair of adjacent power semiconductor modules 21.

Specifically, setting pressure $P_{set}$ of dry gas 55 in hermetic housing 11 is set to be equal to or larger than the sum of ambient pressure $P_0$ outside hermetic housing 11 at the time of injection of dry gas 55 into internal space 19 in hermetic housing 11 and a differential pressure $\Delta P_{(0-i\_min)}$. Differential pressure $\Delta P_{(0-i\_min)}$ is given as a difference between ambient pressure $P_0$ and lower limit pressure $P_{i\_min}$ of dry gas 55 at lower limit temperature $T_{i\_min}$ of the range of temperatures where power conversion apparatus 10 is used, dry gas 55 being at ambient pressure $P_0$ at ambient temperature $T_0$ outside hermetic housing 11 at the time of injection of dry gas 55 into internal space 19 in hermetic housing 11. In other words, setting pressure $P_{set}$ of dry gas 55 in hermetic housing 11 is determined to satisfy expressions (1) and (2) below.

$$P_{set} \geq P_0 + \Delta P_{(0-i\_min)} \tag{1}$$

$$\Delta P_{(0-i\_min)} = P_0 - P_{i\_min} \tag{2}$$

Then, based on the equation of state of gas, as shown with a dotted line in FIG. 12, pressure $P_i$ of dry gas 55 in hermetic housing 11 varies with temperature $T_i$ of internal space 19 in hermetic housing 11. Insulating design of power conversion apparatus 10 for avoiding partial discharge in power conversion apparatus 10 at ambient pressure $P_0$ can reliably prevent occurrence of partial discharge in power conversion apparatus 10 at lower limit temperature $T_{i\_min}$ of the range of temperatures where hermetic housing 11 is used. Such insulating design of power conversion apparatus 10 can be made, for example, by setting an insulation distance between two members of power conversion apparatus 10 different from each other in voltage at ambient pressure $P_0$. Occurrence of partial discharge in power conversion apparatus 10 while the aircraft (for example, electric aircraft 1) is flying at a high altitude can thus reliably be prevented.

Hermetic housing 11 has mechanical strength sufficient to withstand a pressure $P_{i\_max2}$ of dry gas 55 at upper limit temperature $T_{i\_max}$ of the range of temperatures where hermetic housing 11 is used.

Effects of power conversion apparatus 10, the electric power system (electric power system 5) for the aircraft (for example, electric aircraft 1), and the method of controlling power conversion apparatus 10 in the present embodiment will be described.

Power conversion apparatus 10 in the present embodiment includes hermetic housing 11, power semiconductor module 21, and dry gas 55. Hermetic housing 11 includes gas inlet valve 15 and gas outlet valve 16. Power semiconductor module 21 is arranged in internal space 19 in hermetic housing 11. Internal space 19 in hermetic housing 11 is filled with dry gas 55.

Internal space 19 in hermetic housing 11 is filled with dry gas 55. Therefore, even in an environment at a higher humidity such as an aircraft (for example, electric aircraft 1) which is flying at a high altitude, the humidity of internal space 19 in hermetic housing 11 is maintained low. Occurrence of condensation in power semiconductor module 21 arranged in internal space 19 in hermetic housing 11 is prevented. Occurrence of poor insulation, electromigration, and corrosion in power semiconductor module 21 due to condensation can be prevented. Even in an environment at a lower barometric pressure such as the aircraft which is flying at the high altitude, the pressure of internal space 19 in hermetic housing 11 is kept high. Therefore, lowering in discharge start voltage of power semiconductor module 21 can be prevented and occurrence of partial discharge in power semiconductor module 21 can be prevented. Power conversion apparatus 10 can thus be used in the environment at the lower barometric pressure and the higher humidity.

Because of a malfunction or a failure of power semiconductor module 21, the temperature of power semiconductor module 21 may abruptly increase and the pressure of dry gas 55 in hermetic housing 11 may abruptly increase. As the pressure of dry gas 55 in hermetic housing 11 abruptly increases, gas outlet valve 16 is opened, dry gas 55 is emitted to the outside of hermetic housing 11, and the pressure of dry gas 55 in hermetic housing 11 lowers. Thus, on the occurrence of the malfunction or the failure of power semiconductor module 21, gas outlet valve 16 prevents hermetic housing 11 from being broken.

In power conversion apparatus 10 in the present embodiment, the pressure (setting $P_{set}$) of dry gas 55 in hermetic housing 11 is higher than ambient pressure $P_0$ outside hermetic housing 11 at the time of injection of dry gas 55 into internal space 19 in hermetic housing 11.

Since the pressure of dry gas 55 in hermetic housing 11 is relatively high, occurrence of partial discharge in power conversion apparatus 10 can be prevented. Power conversion apparatus 10 can be used in the environment at the lower barometric pressure and the higher humidity. On the premise that the pressure in hermetic housing 11 is equal to or higher than ambient pressure $P_0$ while power conversion apparatus 10 is used, insulating design of power conversion apparatus 10 can be made. Therefore, an insulation distance between components that compose power conversion apparatus 10 is decreased. Power conversion apparatus 10 is reduced in size. A parasitic inductance and a parasitic resistance of power conversion apparatus 10 are lowered and power conversion efficiency of power conversion apparatus 10 improves.

In power conversion apparatus 10 in the present embodiment, the pressure (setting $P_{set}$) of dry gas 55 in hermetic housing 11 is equal to or higher than the sum of ambient pressure $P_0$ and differential pressure $\Delta P_{(0-i\_min)}$. Differential pressure $\Delta P_{(0-i\_min)}$ is given as a difference between ambient pressure $P_0$ and lower limit pressure $P_{i\_min}$ of dry gas 55 at lower limit temperature $T_{i\_min}$ of the range of temperatures where power conversion apparatus 10 is used, dry gas 55 being at ambient pressure $P_0$ at ambient temperature $T_0$ outside hermetic housing 11 at the time of injection of dry gas 55 into internal space 19 in hermetic housing 11.

Since the pressure of dry gas 55 in hermetic housing 11 is relatively high, occurrence of partial discharge in power conversion apparatus 10 can be prevented. Power conversion apparatus 10 can be used in the environment at the lower barometric pressure and the higher humidity. On the premise that the pressure in hermetic housing 11 is equal to or higher than ambient pressure $P_0$ while power conversion apparatus 10 is used, insulating design of power conversion apparatus 10 can be made. Therefore, an insulation distance between components that compose power conversion apparatus 10 is decreased. Power conversion apparatus 10 is reduced in size. A parasitic inductance and a parasitic resistance of power conversion apparatus 10 are lowered and power conversion efficiency of power conversion apparatus 10 improves.

Power conversion apparatus 10 in the present embodiment is mounted on the aircraft (for example, electric aircraft 1). While the aircraft is moving, gas inlet valve 15 and gas outlet valve 16 are kept closed.

Therefore, even when power conversion apparatus 10 is in the environment at the lower barometric pressure and the higher humidity while the aircraft (for example, electric aircraft 1) is flying, occurrence of poor insulation, electromigration, corrosion, and partial discharge in power semiconductor module 21 can be prevented. Power conversion apparatus 10 can be used in the environment at the lower barometric pressure and the higher humidity.

Power conversion apparatus 10 in the present embodiment further includes valve controller 81 to control at least one of gas inlet valve 15 or gas outlet valve 16. Valve controller 81 has at least one of gas inlet valve 15 or gas outlet valve 16 open only while the aircraft (for example, electric aircraft 1) remains stopped.

Therefore, while the aircraft (for example, electric aircraft 1) remains stopped, dry gas 55 can be injected into internal space 19 in hermetic housing 11 or the pressure or the humidity of dry gas 55 in hermetic housing 11 can be adjusted.

In power conversion apparatus 10 in the present embodiment, a partial pressure of water vapor contained in dry gas 55 at a maximum temperature of the range of temperatures where occurrence of condensation in internal space 19 in hermetic housing 11 is permitted is equal to or lower than a saturated water vapor pressure at the maximum temperature.

Therefore, occurrence of poor insulation, electromigration, and corrosion in power semiconductor module 21 can further be prevented. Power conversion apparatus 10 can be used in the environment at the lower barometric pressure and the higher humidity.

In power conversion apparatus 10 in the present embodiment, dry gas 55 is dry air, dry nitrogen gas, or mixture gas of dry air and dry nitrogen gas.

Therefore, occurrence of poor insulation, electromigration, corrosion, and partial discharge in power semiconductor module 21 can be prevented. Power conversion apparatus 10 can be used in the environment at the lower barometric pressure and the higher humidity. When dry nitrogen gas or mixture gas of dry air and dry nitrogen gas is employed as dry gas 55, burning of power semiconductor module 21 on the occurrence of a malfunction or a failure of power conversion apparatus 10 can be prevented.

The electric power system (electric power system 5) for the aircraft in the present embodiment includes power supply 6 and power conversion apparatus 10 in the present embodiment electrically connected to power supply 6.

Therefore, occurrence of poor insulation, electromigration, corrosion, and partial discharge in power semiconductor module 21 can be prevented. The electric power system for the aircraft can be used in the environment at the lower barometric pressure and the higher humidity.

The method of controlling a power conversion apparatus in the present embodiment is the method of controlling power conversion apparatus 10. Power conversion apparatus 10 is mounted on the aircraft (for example, electric aircraft 1). The method of controlling power conversion apparatus 10 in the present embodiment includes closing gas inlet valve 15 and gas outlet valve 16 while the aircraft is moving.

Therefore, even when power conversion apparatus 10 is in the environment at the lower barometric pressure and the higher humidity while the aircraft (for example, electric aircraft 1) is flying, occurrence of poor insulation, electromigration, corrosion, and partial discharge in power semiconductor module 21 can be prevented. The method of controlling a power conversion apparatus in the present embodiment allows use of power conversion apparatus 10 in the environment at the lower barometric pressure and the higher humidity such as the flying aircraft.

The method of controlling a power conversion apparatus in the present embodiment further includes opening at least one of gas inlet valve 15 or gas outlet valve 16 only while the aircraft (for example, electric aircraft 1) remains stopped.

Therefore, while the aircraft (for example, electric aircraft 1) remains stopped, dry gas 55 can be injected into internal space 19 in hermetic housing 11 or the pressure or the humidity of dry gas 55 in hermetic housing 11 can be adjusted. The method of controlling a power conversion apparatus in the present embodiment allows use of power conversion apparatus 10 in the environment at the lower barometric pressure and the higher humidity such as the inside of the airframe of the flying aircraft.

Second Embodiment

Figure 13:
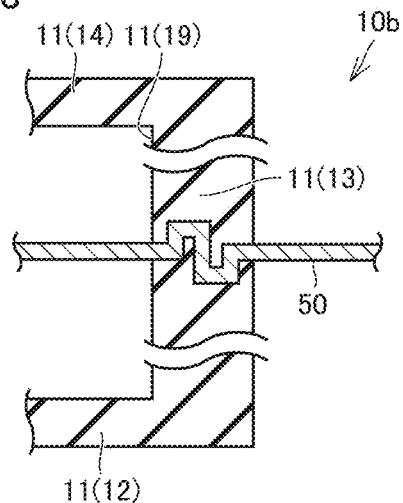
FIG. 13 is a partially enlarged schematic cross-sectional view of a power conversion apparatus in a second embodiment.

A power conversion apparatus 10b in a second embodiment will be described with reference to FIG. 13. Though power conversion apparatus 10b in the present embodiment is similar in configuration to power conversion apparatus 10 in the first embodiment, it is mainly different in aspects below.

In power conversion apparatus 10b, bus bar 50 is bent in the inside of the wall (for example, sidewall 13) of hermetic housing 11. Particularly, bus bar 50 may meander in the inside of the wall (for example, sidewall 13) of hermetic housing 11. Similarly to bus bar 50, bus bar 52 may also be bent or meander in the inside of the wall (for example, sidewall 13) of hermetic housing 11. In an example where hermetic housing 11 is formed of a resin, bus bars 50 and 52 that are bent or meander can be provided in hermetic housing 11 by insert molding.

Figure 14:
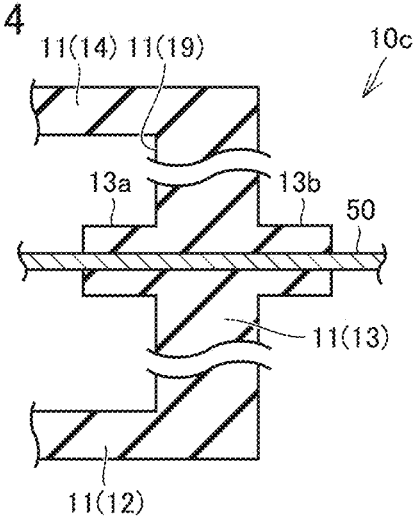
FIG. 14 is a partially enlarged schematic cross-sectional view of a power conversion apparatus in a first modification of the second embodiment.

Referring to FIG. 14, in a power conversion apparatus 10c in a first modification of the present embodiment, hermetic housing 11 further includes at least one protrusion 13a or 13b that protrudes from the wall (for example, sidewall 13) of hermetic housing 11. Particularly, hermetic housing 11 further includes protrusion 13a and protrusion 13b that protrude from the wall (for example, sidewall 13) of hermetic housing 11. Protrusion 13a protrudes from the wall (for example, sidewall 13) of hermetic housing 11 into internal space 19 in hermetic housing 11. Protrusion 13b protrudes from the wall (for example, sidewall 13) of hermetic housing 11 toward the outside of hermetic housing 11. Bus bar 50 passes through the wall (for example, sidewall 13) of hermetic housing 11 and at least one protrusion 13a or 13b. Similarly to bus bar 50, bus bar 52 may also pass through the wall (for example, sidewall 13) of hermetic housing 11 and at least one protrusion 13a or 13b.

Figure 15:
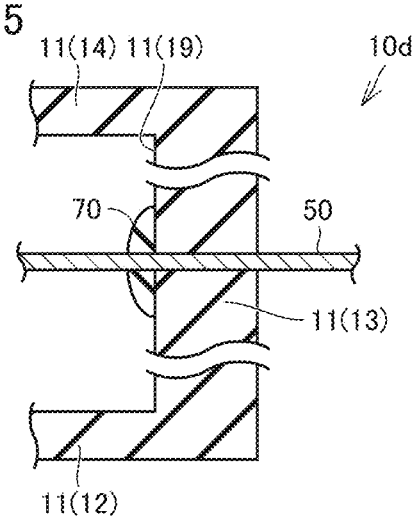
FIG. 15 is a partially enlarged schematic cross-sectional view of a power conversion apparatus in a second modification of the second embodiment.

Referring to FIG. 15, a power conversion apparatus 10d in a second modification of the present embodiment further includes a sealing resin member 70. Sealing resin member 70 is formed, for example, of a silicone resin. The wall (for example, sidewall 13) of hermetic housing 11 and bus bar 50 are continuously covered with sealing resin member 70. Specifically, the wall (for example, sidewall 13) of hermetic housing 11 and a root portion of bus bar 50 are covered with sealing resin member 70. In a protruding portion of bus bar 50 that protrudes from the wall (for example, sidewall 13) of hermetic housing 11 into internal space 19, the root portion of bus bar 50 is a portion proximate to the wall (for example, sidewall 13) of hermetic housing 11. The wall (for example, sidewall 13) of hermetic housing 11 and bus bar 52 may further continuously be covered with sealing resin member 70.

Power conversion apparatuses 10b, 10c, and 10d in the present embodiment further achieve effects below in addition to the effects of power conversion apparatus 10 in the first embodiment.

Power conversion apparatus 10b in the present embodiment further includes bus bars 50 and 52. Hermetic housing 11 includes the wall (for example, sidewall 13) which defines internal space 19 in hermetic housing 11. Bus bars 50 and 52 pass through the wall (for example, sidewall 13) and are bent in the inside of the wall (for example, sidewall 13).

The bent portion of each of bus bars 50 and 52 functions as an anchor in the wall (for example, sidewall 13) of hermetic housing 11. Bus bars 50 and 52 are each joined to hermetic housing 11 over a wider area. Therefore, strength of joint between hermetic housing 11 and bus bars 50 and 52 increases. Leakage of dry gas 55 from internal space 19 in hermetic housing 11 to the outside of hermetic housing 11 can be prevented. Therefore, a relatively high pressure of dry gas 55 in internal space 19 in hermetic housing 11 can be maintained. Occurrence of partial discharge in power semiconductor module 21 can be prevented. Power conversion apparatus 10b can be used in the environment at the lower barometric pressure and the higher humidity.

Power conversion apparatus 10c in the present embodiment further includes bus bars 50 and 52. Hermetic housing 11 includes the wall (for example, sidewall 13) which defines internal space 19 in hermetic housing 11 and at least one protrusion 13a or 13b that protrudes from the wall (for example, sidewall 13). Bus bar 50, 52 passes through the wall and at least one protrusion 13a or 13b.

Since bus bars 50 and 52 are each joined to hermetic housing 11 over a wider area, strength of joint between hermetic housing 11 and bus bars 50 and 52 increases. Leakage of dry gas 55 from internal space 19 in hermetic housing 11 to the outside of hermetic housing 11 can be prevented. Therefore, a relatively high pressure of dry gas 55 in internal space 19 in hermetic housing 11 can be maintained. Occurrence of partial discharge in power semiconductor module 21 can be prevented. Power conversion apparatus 10c can be used in the environment at the lower barometric pressure and the higher humidity.

Power conversion apparatus 10d in the present embodiment further includes bus bars 50 and 52 and sealing resin member 70. Hermetic housing 11 includes the wall (for example, sidewall 13) which defines internal space 19 in hermetic housing 11. Bus bars 50 and 52 pass through the wall (for example, sidewall 13). The wall (for example, sidewall 13) and bus bars 50 and 52 are continuously covered with sealing resin member 70.

Sealing resin member 70 can prevent leakage of dry gas 55 from internal space 19 in hermetic housing 11 to the outside of hermetic housing 11. Therefore, a relatively high pressure of dry gas 55 in internal space 19 in hermetic housing 11 can be maintained. Occurrence of partial discharge in power semiconductor module 21 can be prevented. Power conversion apparatus 10d can be used in the environment at the lower barometric pressure and the higher humidity.

Third Embodiment

Figure 16:
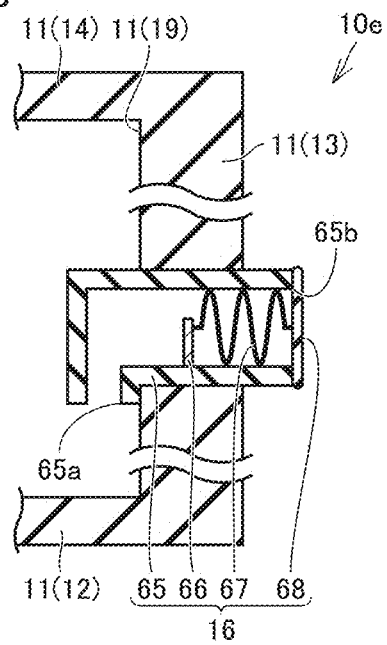
FIG. 16 is a partially enlarged schematic cross-sectional view of a power conversion apparatus in a third embodiment.

A power conversion apparatus 10e in a third embodiment will be described with reference to FIG. 16. Though power conversion apparatus 10e in the present embodiment is similar in configuration to power conversion apparatus 10 in the first embodiment, it is mainly different in aspects below.

In power conversion apparatus 10e, pipe 65 of gas outlet valve 16 is bent in internal space 19 in hermetic housing 11. For example, pipe 65 is bent at an angle not smaller than 60° and not larger than 120° in a longitudinal direction of pipe 65. Particularly, pipe 65 is bent at an angle not smaller than 80° and not larger than 100° in the longitudinal direction of pipe 65. Inlet 65a of pipe 65 may face bottom wall 12 or top wall 14 of hermetic housing 11.

Figure 17:
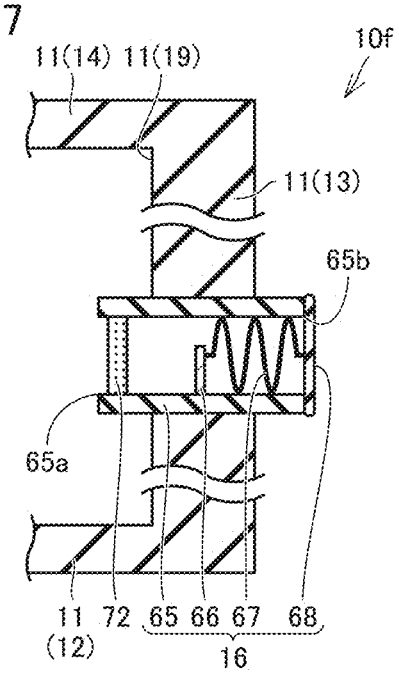
FIG. 17 is a partially enlarged schematic cross-sectional view of a power conversion apparatus in a modification of the third embodiment.

Referring to FIG. 17, in a power conversion apparatus 10f in a modification of the present embodiment, gas outlet valve 16 further includes a ventilation filter 72 arranged in pipe 65. Ventilation filter 72 allows passage therethrough of gas such as dry gas 55 or air, but blocks passage of fragments of a component of power semiconductor module 21 through pipe 65. For example, a polymer porous membrane or a ceramic porous membrane can be employed for ventilation filter 72.

Power conversion apparatuses 10e and 10f in the present embodiment further achieve effects below in addition to the effects of power conversion apparatus 10 in the first embodiment.

In power conversion apparatus 10e in the present embodiment, gas outlet valve 16 includes pipe 65 and lid 68. Pipe 65 includes inlet 65a arranged in internal space 19 in hermetic housing 11 and outlet 65b arranged outside hermetic housing 11. Outlet 65b can be opened and closed by lid 68. Pipe 65 is bent in internal space 19 in hermetic housing 11.

Therefore, even when a component of power semiconductor module 21 is broken while power conversion apparatus 10e is operating, pipe 65 bent in internal space 19 in hermetic housing 11 can prevent fragments of the component of power semiconductor module 21 from scattering to the outside of power conversion apparatus 10e.

In power conversion apparatus 10f in the present embodiment, gas outlet valve 16 includes pipe 65, lid 68, and ventilation filter 72 arranged in pipe 65. Pipe includes inlet 65a arranged in internal space 19 in hermetic housing 11 and outlet 65b arranged outside hermetic housing 11. Outlet 65b can be opened and closed by lid 68.

Therefore, even when a component of power semiconductor module 21 is broken while power conversion apparatus 10e is operating, ventilation filter 72 can prevent fragments of the component of power semiconductor module 21 from scattering to the outside of power conversion apparatus 10e.

Fourth Embodiment

Figure 18:
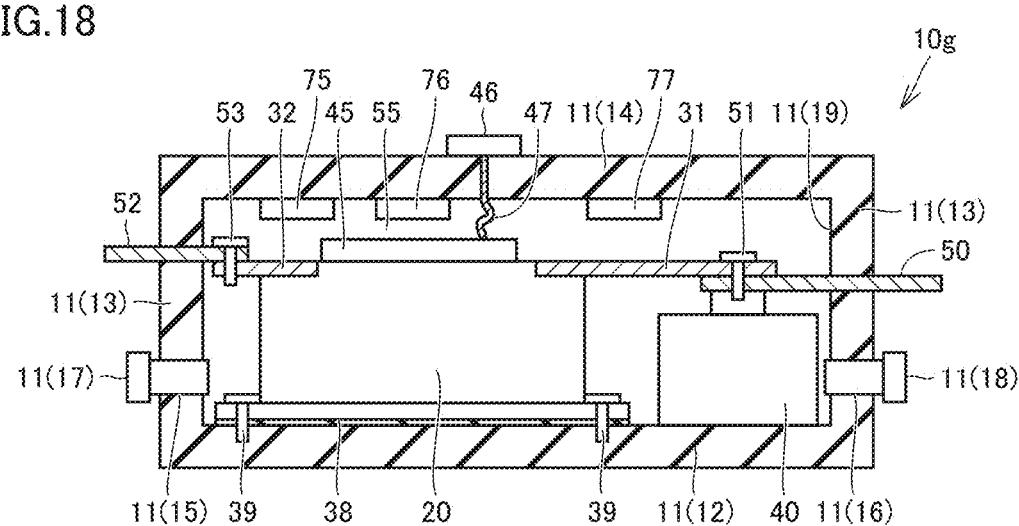
FIG. 18 is a schematic cross-sectional view of a power conversion apparatus in a fourth embodiment.

A power conversion apparatus 10g in a fourth embodiment will be described with reference to FIGS. 18 and 19. Though power conversion apparatus 10g in the present embodiment is similar in configuration to power conversion apparatus 10 in the first embodiment, it is mainly different in aspects below.

Power conversion apparatus 10g further includes a sensor capable of measuring at least one of a temperature or a humidity of dry gas 55 in hermetic housing 11. Specifically, power conversion apparatus 10g includes a temperature sensor 75 and a humidity sensor 76. Temperature sensor 75 can measure a temperature of dry gas 55 in hermetic housing 11. Humidity sensor 76 can measure a humidity of dry gas 55 in hermetic housing 11. Power conversion apparatus 10g may further include a pressure sensor 77 capable of measuring a pressure of dry gas 55 in hermetic housing 11.

Temperature sensor 75, humidity sensor 76, and pressure sensor 77 are arranged in internal space 19 in hermetic housing 11. Specifically, temperature sensor 75, humidity sensor 76, and pressure sensor 77 are attached to an inner surface of a wall (for example, top wall 14) which defines internal space 19 in hermetic housing 11.

Figure 19:
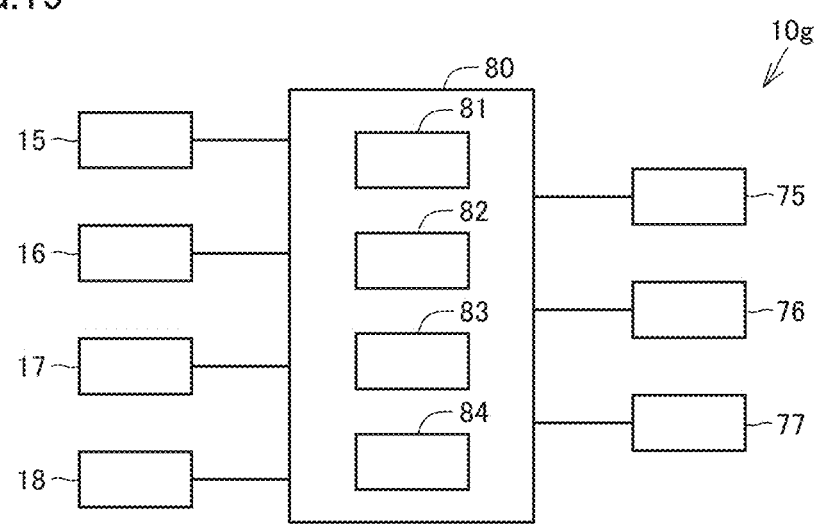
FIG. 19 is a block diagram of the power conversion apparatus in the fourth embodiment.

Referring to FIG. 19, in power conversion apparatus 10g, controller 80 further includes a remaining lifetime predictor 83 and a memory 84. Remaining lifetime predictor 83 is implemented, for example, by an electrical circuit to predict a remaining lifetime of power semiconductor module 21 or a semiconductor processor programmed to predict a remaining lifetime of power semiconductor module 21. Memory 84 is, for example, a ROM, a RAM, a hard disk, a solid state drive (SSD), or the like.

In one example, remaining lifetime predictor 83 predicts a remaining lifetime of power semiconductor module 21 based on change over time in temperature of dry gas 55 in hermetic housing 11 measured with temperature sensor 75. When a rotation speed of motor 3a (see FIG. 1) increases or decreases, an amount of heat generated in power semiconductor module 21 also increases or decreases and the temperature of power semiconductor module 21 also increases or decreases. As an iterative temperature cycle is applied to power semiconductor module 21, power semiconductor module 21 gradually deteriorates due to a difference in coefficient of thermal expansion between components of power semiconductor module 21. A temperature cycle test is conducted on power semiconductor module 21 in advance and a result of the temperature cycle test is stored in memory 84.

Remaining lifetime predictor 83 refers to the result of the temperature cycle test stored in memory 84, and predicts the remaining lifetime of power semiconductor module 21 based on change over time in temperature of dry gas 55 in hermetic housing 11 measured with temperature sensor 75. Remaining lifetime predictor 83 outputs the predicted remaining lifetime of power semiconductor module 21 to memory 84 or an image display (not shown) such as a liquid crystal display.

In another example, remaining lifetime predictor 83 predicts the remaining lifetime of power semiconductor module 21 based on change over time in temperature of dry gas 55 in hermetic housing 11 measured with temperature sensor 75 and change over time in humidity of dry gas 55 in hermetic housing 11 measured with humidity sensor 76. As the iterative temperature cycle is applied to power semiconductor module 21 as above, power semiconductor module 21 gradually deteriorates. As the humidity of an atmosphere around power semiconductor module 21 increases, a leakage current of power semiconductor elements 26a and 26b (see FIG. 5) increases or electromigration occurs in power semiconductor module 21, and hence power semiconductor module 21 gradually deteriorates. A temperature-humidity-bias (THB) test is conducted on power semiconductor module 21 in advance and a result of the THB test is stored in memory 84.

Remaining lifetime predictor 83 refers to the result of the THB test stored in memory 84 and predicts the remaining lifetime of power semiconductor module 21 based on change over time in temperature of dry gas 55 in hermetic housing 11 measured with temperature sensor 75 and change over time in humidity of dry gas 55 in hermetic housing 11 measured with humidity sensor 76. Remaining lifetime predictor 83 outputs the predicted remaining lifetime of power semiconductor module 21 to memory 84 or an image display (not shown) such as a liquid crystal display.

Power conversion apparatus 10g in the present embodiment further achieves effects below in addition to the effects of power conversion apparatus 10 in the first embodiment.

Power conversion apparatus 10g in the present embodiment further includes a sensor (for example, temperature sensor 75 or humidity sensor 76) capable of measuring at least one of the temperature or the humidity of dry gas 55 in hermetic housing 11. Since a state of dry gas 55 in hermetic housing 11 can be monitored, maintenance of power conversion apparatus 10g is facilitated.

Power conversion apparatus 10g in the present embodiment further includes remaining lifetime predictor 83. The sensor includes temperature sensor 75 capable of measuring the temperature of dry gas 55 in hermetic housing 11. Remaining lifetime predictor 83 predicts the remaining lifetime of power semiconductor module 21 based on change over time in temperature of dry gas 55 in hermetic housing 11 measured with temperature sensor 75. Therefore, timing of maintenance or timing of replacement of power semiconductor module 21 can be predicted.

Power conversion apparatus 10g in the present embodiment further includes remaining lifetime predictor 83. The sensor includes temperature sensor 75 capable of measuring the temperature of dry gas 55 in hermetic housing 11 and humidity sensor 76 capable of measuring the humidity of dry gas 55 in hermetic housing 11. Remaining lifetime predictor 83 predicts the remaining lifetime of power semiconductor module 21 based on change over time in temperature of dry gas 55 in hermetic housing 11 measured with temperature sensor 75 and change over time in humidity of dry gas 55 in hermetic housing 11 measured with humidity sensor 76. Therefore, timing of maintenance or timing of replacement of power semiconductor module 21 can be predicted.

Fifth Embodiment

Figure 20:
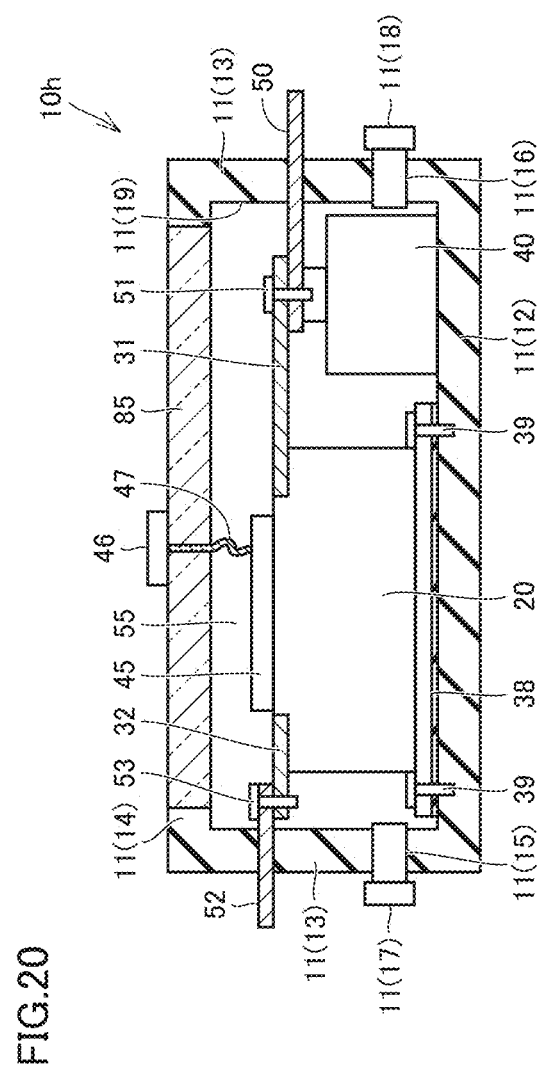
FIG. 20 is a schematic cross-sectional view of a power conversion apparatus in a fifth embodiment.

A power conversion apparatus 10h in a fifth embodiment will be described with reference to FIG. 20. Though power conversion apparatus 10h in the present embodiment is similar in configuration to power conversion apparatus 10 in the first embodiment, it is mainly different in aspects below.

In power conversion apparatus 10h, hermetic housing 11 includes a transparent wall 85 as a part of the wall (for example, top wall 14) which defines internal space 19 in hermetic housing 11. Transparent wall 85 allows visual recognition of at least one of control circuit substrate 45 or thermally conductive layer 38 from the outside of hermetic housing 11. Transparent wall 85 may further allow visual recognition of power semiconductor module 21 and capacitor 40 from the outside of hermetic housing 11. It is sufficient for transparent wall 85 to make a component arranged in internal space 19 in hermetic housing 11 visible from the outside of hermetic housing 11, and it includes a semitransparent wall. Transparent wall 85 is formed, for example, of a transparent resin such as an acrylic or a polycarbonate resin.

Power conversion apparatus 10h in the present embodiment further achieves effects below in addition to the effects of power conversion apparatus 10 in the first embodiment.

Power conversion apparatus 10h in the present embodiment further includes at least one of control circuit substrate 45 or thermally conductive layer 38. Control circuit substrate 45 is electrically connected to power semiconductor module 21. Thermally conductive layer 38 is arranged between power semiconductor module 21 and hermetic housing 11. Hermetic housing 11 includes transparent wall 85 that allows visual recognition of at least one of control circuit substrate 45 or thermally conductive layer 38 from the outside of hermetic housing 11.

Therefore, an initial fault contained in at least one of control circuit substrate 45 or thermally conductive layer 38 can visually be found through transparent wall 85 from the outside of power conversion apparatus 10h. Transparent wall 85 facilitates discovery of the initial fault of power conversion apparatus 10h. In maintenance of power conversion apparatus 10h, at least one of control circuit substrate 45 or thermally conductive layer 38 can visually be inspected through transparent wall 85 from the outside of power conversion apparatus 10h. Transparent wall 85 facilitates maintenance of power conversion apparatus 10h.

The structure of power conversion apparatuses 10, 10b, 10c, 10d, 10e, 10f, 10g, and 10h in the first to fifth embodiments and the modifications thereof is applicable also to DC converter 7. It should be understood that the first to fifth embodiments and the modifications thereof disclosed herein are illustrative and non-restrictive in every respect. Unless there is inconsistency, at least two of the first to fifth embodiments and the modifications thereof disclosed herein may be combined. The scope of the present disclosure is defined by the terms of the claims rather than the description above and is intended to include any modifications within the scope and meaning equivalent to the terms of the claims.

REFERENCE SIGNS LIST 1 electric aircraft; 2 airframe; 3 electric engine; 3a motor, 3b fan; 4 flight control device; 5 electric power system; 6 power supply; 7 DC converter, 10, 10b, 10c, 10d, 10e, 10f, 10g, 10h power conversion apparatus; 11 hermetic housing; 12 bottom wall; 13 sidewall; 13a, 13b protrusion; 14 top wall; 15 gas inlet valve; 16 gas outlet valve; 17, 18 cap; 19 internal space; 21 power semiconductor module; 22 insulating substrate; 23 insulating layer; 24 conductive circuit pattern; 24a first conductive circuit pattern portion; 24b second conductive circuit pattern portion; 25 base plate; 26a, 26b power semiconductor element; 28a, 28b conductive joint member; 30 casing; 31 input terminal; 32 output terminal; 33, 34, 35 conductive wire; 36 sealing member; 38 thermally conductive layer; 39, 51, 53 fixing member; 40 capacitor; 45 control circuit substrate; 46 connector, 47 signal line; 50, 52 bus bar, 55 dry gas; 60, 65 pipe; 60a, 65a inlet; 60b, 65b outlet; 61, 66 post; 62, 67 spring; 63, 68 lid; 70 sealing resin member, 72 ventilation filter; 75 temperature sensor; 76 humidity sensor; 77 pressure sensor; 80 controller, 81 valve controller, 82 cap controller, 83 remaining lifetime predictor; 84 memory; 85 transparent wall

The invention claimed is:

1. A power conversion apparatus for an aircraft comprising:
    a hermetic housing including a gas inlet valve and a gas outlet valve;
    a power semiconductor module in an internal space in the hermetic housing; and
    dry gas with which the internal space in the hermetic housing is filled,
    wherein while the aircraft is moving, the gas inlet valve and the gas outlet valve are kept closed.

2. The power conversion apparatus according to claim 1, wherein a pressure of the dry gas in the hermetic housing is higher than an ambient pressure outside the hermetic housing at time of injection of the dry gas into the internal space in the hermetic housing.

3. The power conversion apparatus according to claim 1, wherein
a partial pressure of water vapor contained in the dry gas at a maximum temperature of a range of temperatures where occurrence of condensation in the internal space in the hermetic housing is permitted is equal to or lower than a saturated water vapor pressure at the maximum temperature.

4. The power conversion apparatus according to claim 1, wherein
the dry gas is dry air, dry nitrogen gas, or mixture gas of dry air and dry nitrogen gas.

5. The power conversion apparatus according to claim 1, further comprising:
a valve controller to control at least one of the gas inlet valve or the gas outlet valve, wherein
the valve controller has at least one of the gas inlet valve or the gas outlet valve open only while the aircraft remains stopped.

6. The power conversion apparatus according to claim 1, further comprising a bus bar, wherein
the hermetic housing includes a wall which defines the internal space in the hermetic housing, and
the bus bar passes through the wall and is bent in inside of the wall.

7. The power conversion apparatus according to claim 1, further comprising a bus bar, wherein
the hermetic housing includes a wall which defines the internal space in the hermetic housing and at least one protrusion which protrudes from the wall, and
the bus bar passes through the wall and the at least one protrusion.

8. The power conversion apparatus according to claim 1, further comprising:
a bus bar; and
a sealing resin member, wherein
the hermetic housing includes a wall which defines the internal space in the hermetic housing,
the bus bar passes through the wall, and
the wall and the bus bar are continuously covered with the sealing resin member.

9. The power conversion apparatus according to claim 1, wherein
the gas outlet valve includes a pipe and a lid,
the pipe includes an inlet in the internal space in the hermetic housing and an outlet outside the hermetic housing,
the outlet can be opened and closed by the lid, and
the pipe is bent in the internal space in the hermetic housing.

10. The power conversion apparatus according to claim 1, wherein
the gas outlet valve includes a pipe, a lid, and a ventilation filter in the pipe,
the pipe includes an inlet in the internal space in the hermetic housing and an outlet outside the hermetic housing, and
the outlet can be opened and closed by the lid.

11. The power conversion apparatus according to claim 1, further comprising a sensor to measure at least one of a temperature or a humidity of the dry gas in the hermetic housing.

12. The power conversion apparatus according to claim 11, further comprising a remaining lifetime predictor, wherein
the sensor includes a temperature sensor to measure the temperature of the dry gas in the hermetic housing, and
the remaining lifetime predictor predicts a remaining lifetime of the power semiconductor module based on change over time in temperature of the dry gas in the hermetic housing measured with the temperature sensor.

13. The power conversion apparatus according to claim 11, further comprising a remaining lifetime predictor, wherein
the sensor includes a temperature sensor to measure the temperature of the dry gas in the hermetic housing and a humidity sensor to measure the humidity of the dry gas in the hermetic housing, and
the remaining lifetime predictor predicts a remaining lifetime of the power semiconductor module based on change over time in temperature of the dry gas in the hermetic housing measured with the temperature sensor and change over time in humidity of the dry gas in the hermetic housing measured with the humidity sensor.

14. The power conversion apparatus according to claim 1, further comprising at least one of a control circuit substrate or a thermally conductive layer, wherein
the control circuit substrate is electrically connected to the power semiconductor module,
the thermally conductive layer is between the power semiconductor module and the hermetic housing, and
the hermetic housing includes a transparent wall that allows visual recognition of the at least one of the control circuit substrate or the thermally conductive layer from outside of the hermetic housing.

15. An electric power system for an aircraft comprising:
a power supply; and
the power conversion apparatus according to claim 1 electrically connected to the power supply.

16. A power conversion apparatus for an aircraft, comprising:
a hermetic housing including a gas inlet valve and a gas outlet valve;
a power semiconductor module in an internal space in the hermetic housing; and
dry gas with which the internal space in the hermetic housing is filled,
wherein:
a pressure of the dry gas in the hermetic housing is higher than an ambient pressure outside the hermetic housing at time of injection of the dry gas into the internal space in the hermetic housing,
the pressure of the dry gas in the hermetic housing is equal to or higher than a sum of the ambient pressure and a differential pressure, and
the differential pressure is given as a difference between the ambient pressure and a lower limit pressure of the dry gas at a lower limit temperature of a range of temperatures where the power conversion apparatus is used, the dry gas being at the ambient pressure at an ambient temperature outside the hermetic housing at the time of injection of the dry gas into the internal space in the hermetic housing.

17. A method of controlling a power conversion apparatus for an aircraft, the power conversion apparatus including a hermetic housing including a gas inlet valve and a gas outlet valve; a power semiconductor module in an internal space in the hermetic housing; and dry gas with which the internal space in the hermetic housing is filled, the method comprising:
 keeping the gas inlet valve and the gas outlet valve closed while the aircraft is moving.

18. The method of controlling a power conversion apparatus according to claim 17, further comprising:
 opening at least one of the gas inlet valve or the gas outlet valve only while the aircraft remains stopped.

* * * * *